(12) United States Patent
Kim et al.

(10) Patent No.: US 10,211,661 B2
(45) Date of Patent: Feb. 19, 2019

(54) CHARGING MODE CONTROL METHOD AND DEVICE

(71) Applicant: Samsung Electronics Co., Ltd., Suwon-si, Gyeonggi-do (KR)

(72) Inventors: Jong Min Kim, Yongin-si (KR); Yeong Bok Choi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 335 days.

(21) Appl. No.: 14/598,651

(22) Filed: Jan. 16, 2015

(65) Prior Publication Data

US 2015/0236528 A1 Aug. 20, 2015

(30) Foreign Application Priority Data

Feb. 18, 2014 (KR) ........................ 10-2014-0018713

(51) Int. Cl.
*H02J 7/00* (2006.01)
*G01R 31/36* (2006.01)
*G01R 17/00* (2006.01)

(52) U.S. Cl.
CPC .............. *H02J 7/007* (2013.01); *G01R 17/00* (2013.01); *G01R 31/362* (2013.01)

(58) Field of Classification Search
CPC ........ H02J 7/0054; H02J 7/007; G01R 17/00; G01R 31/362
USPC .................................................. 320/103, 107
See application file for complete search history.

(56) References Cited

U.S. PATENT DOCUMENTS

| 6,154,008 A * | 11/2000 | Bradus | H01M 10/44 |
| | | | 320/125 |
| 8,161,316 B1 | 4/2012 | Manning et al. | |
| 9,348,656 B2 | 5/2016 | Presant et al. | |
| 2013/0043831 A1* | 2/2013 | Hu | H02J 7/0068 |
| | | | 320/107 |
| 2013/0154551 A1 | 6/2013 | Jeansonne et al. | |
| 2013/0159755 A1 | 6/2013 | Presant et al. | |
| 2013/0238048 A1* | 9/2013 | Almendinger | A61N 1/3787 |
| | | | 607/40 |
| 2013/0254580 A1* | 9/2013 | Yan | G06F 1/266 |
| | | | 713/340 |
| 2013/0290764 A1* | 10/2013 | Taki | G06F 1/266 |
| | | | 713/340 |
| 2013/0326254 A1* | 12/2013 | Lorin | G06F 1/3234 |
| | | | 713/323 |
| 2014/0042981 A1* | 2/2014 | Kaizo | H02J 7/007 |
| | | | 320/136 |

(Continued)

FOREIGN PATENT DOCUMENTS

EP 2 629 173 A2 8/2013

OTHER PUBLICATIONS

European Office Action, Summons to Attend Oral Proceedings Pursuant to Rule 115(1) EPC dated Jul. 18, 2017, issued in the European Application No. 15155462.3.

*Primary Examiner* — Nathaniel Pelton
(74) *Attorney, Agent, or Firm* — Jefferson IP Law, LLP

(57) ABSTRACT

A charging control method of a computing system is provided. The method includes determining a charging mode for an external device connected to the computing system, charging the external device according to the charging mode, monitoring a current and a voltage in the computing system, and changing the charging mode based on the result of the monitoring.

5 Claims, 13 Drawing Sheets

(56) References Cited

U.S. PATENT DOCUMENTS

2014/0047248 A1* 2/2014 Heo .................. H02J 7/0068
713/300
2015/0084579 A1* 3/2015 Li .................. H02J 7/0052
320/107

* cited by examiner

CHARGING MODE CONTROL METHOD AND DEVICE

CROSS-REFERENCE TO RELATED APPLICATION(S)

This application claims the benefit under 35 U.S.C. § 119(a) of a Korean patent application filed on Feb. 18, 2014 in the Korean Intellectual Property Office and assigned Serial number 10-2014-0018713, the entire disclosure of which is hereby incorporated by reference.

TECHNICAL FIELD

The present disclosure relates to a technique for controlling charging of an external device connected to a computing system according to a load occurring in a computing system.

BACKGROUND

A computing system such as a laptop Personal Computer (PC) or a desktop PC provides a Universal Serial Bus (USB) or an external port that is connected to an external device such as a smartphone. The computing system may exchange data and communicate with an external device connected through an external port.

The computing system may supply power to an external device connected through an external port. For example, a battery of an external device is charged slowly while connected to a computing system.

Battery capacity and power consumption of an external device connected to a computing system are increasing. For example, the battery capacity of Samsung Galaxy S released in 2010 is 1500 mAh, and the battery capacity of recently released Samsung Galaxy Note 3 is 3200 mAh. The battery capacity has more than doubled in four years. The battery capacity of Samsung Galaxy Note 10.1 is about 8220 mAh. Accordingly, a charging time of an external device through a computing system may also increase. The dedicated adaptor of an external device (for example, Samsung Galaxy S4) provided from a manufacturer typically provides charging of 5V to 1 A. However, when an external device is charged through a USB 2.0 connection port of a computing system instead of a rated (genuine) charger, a current of 500 mA may be supplied (in the case of USB 3.0, a current of 900 mA may be supplied). When the battery of Samsung Galaxy S4 (having a capacity of 2600 mAh) is completely discharged, it takes about 5 hours and 30 minutes to charge the battery through a USB connection port (for example, USB 2.0) of a notebook PC. In order to reduce a charging time, devices or application programs are being provided to increase supply current through a USB connection port.

However, since a computing system has many components (e.g., loads), in order to best utilize a system resource of the computing system and supply high power to an external device, it is necessary to increase the capacity of an adaptor supplying power to the computing system. However, the increase of an adaptor capacity may burden both manufactures and consumers due to the rising costs of materials and the size increase of an adaptor. Additionally, when a high current is provided to an external device while an existing adaptor is used as is, since a power that a computing system utilizes is not sufficient, the computing system's own battery may be discharged or the computing system may be shut down.

The above information is presented as background information only to assist with an understanding of the present disclosure. No determination has been made, and no assertion is made, as to whether any of the above might be applicable as prior art with regard to the present disclosure.

SUMMARY

Aspects of the present disclosure are to address at least the above-mentioned problems and/or disadvantages and to provide at least the advantages described below. Accordingly, an aspect of the present disclosure is to provide a method and device for efficiently controlling a charging state in consideration of a power consumption state of an external device, loads of a computing system and an external device, a capacity of an adaptor when an external device is connected to an external port such as a Universal Serial Bus (USB).

In accordance with an aspect of the present disclosure, a charging control method of a computing system is provided. The charging control method includes determining a charging mode for an external device connected to the computing system, charging the external device according to the charging mode, monitoring a current and a voltage in the computing system, and changing the charging mode based on the result of the monitoring.

In accordance with another aspect of the present disclosure, a method of controlling battery charging of an external device connected to a computing system is provided. The method includes charging the external device through a first charging mode, monitoring a current and a voltage in the computing system, and changing the first charging mode into a second charging mode based on result of the monitoring.

In accordance with another aspect of the present disclosure, a computing system for controlling a charging mode of an external device is provided. The computing system includes an external port configured to provide a connection with the external device, an input current monitoring unit configured to monitor an input current provided from an adaptor, a system voltage monitoring unit configured to monitor a system voltage of the computing system, a trigger circuit unit configured to generate an adaptor limit alarm signal according to the input current monitored by the input current monitoring unit and the system voltage monitored by the system voltage monitoring unit, and a controller configured to detect the adaptor limit alarm signal generated by the trigger circuit unit. The controller changes a charging mode for charging the external device based on the basis of the adaptor limit alarm signal.

In accordance with another aspect of the present disclosure, a charging control method of a computing system is provided. The method includes determining a charging mode for an external device connected to the computing system, charging the external device according to the charging mode, monitoring a Relative State of Charge (RSOC) of a remaining battery power amount of the external device, and changing the charging mode based on a change amount of the RSOC.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

Figure 1:
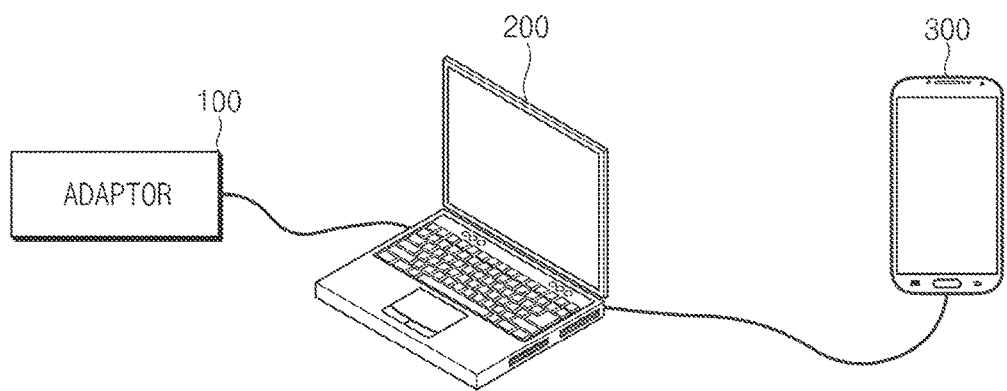
FIG. 1 is a view illustrating a computing system in which an adaptor is connected to an external device according to an embodiment of the present disclosure.

The following description with reference to the accompanying drawings is provided to assist in a comprehensive understanding of various embodiments of the present disclosure as defined by the claims and their equivalents. It includes various specific details to assist in that understanding, but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but are merely used by the inventor to enable a clear and consistent understanding of the present disclosure. Accordingly, it should be apparent to those skilled in the art that the following description of various embodiments of the present disclosure is provided for illustration purposes only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

The term "include," "comprise," and "have", or "may include," or "may comprise" and "may have" used herein indicates disclosed functions, operations, or existence of elements but does not exclude other functions, operations or elements. The meaning of "include," "comprise," "including," or "comprising," specifies a property, a region, a fixed number, a step, a process, an element and/or a component but does not exclude other properties, regions, fixed numbers, steps, processes, elements and/or components.

The meaning of the term "or" used herein includes any or all combinations of the words connected by the term "or". For instance, the expression "A or B" may indicate include A, B, or both A and B.

The terms such as "1st", "2nd", "first", "second", and the like used herein may refer to modifying various different elements of various embodiments, but do not limit the elements. Such terms do not limit the order and/or priority of the elements. Furthermore, such terms may be used to distinguish one element from another element. For example, both "a first user device" and "a second user device" indicate a user device but indicate different user devices. A first component may be referred to as a second component and vice versa without departing from the scope of the present disclosure.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Terms used in this specification are used to describe various embodiments, and are not intended to limit the scope of the present disclosure.

Unless otherwise indicated herein, all the terms used herein, which include technical or scientific terms, may have the same meaning that is generally understood by a person skilled in the art. In general, the terms defined in the dictionary should be considered to have the same meaning as the contextual meaning of the related art, and, unless clearly defined herein, should not be understood abnormally or as having an excessively formal meaning.

Additionally, an electronic device according to an embodiment of the present disclosure may be a device with a charging function. For instance, electronic devices may include at least one of smartphones, tablet personal computers (PCs), mobile phones, video phones, electronic book (e-book) readers, desktop PCs, laptop PCs, netbook computers, personal digital assistants (PDAs), portable multimedia players (PMPs), MP3 players, mobile medical devices, cameras, and wearable devices (e.g., head-mounted-devices (HMDs) such as electronic glasses, electronic apparel, electronic bracelets, electronic necklaces, electronic accessories, electronic tattoos, and smart watches).

According to various embodiments, an electronic device may be smart home appliances having a charging function. The smart home appliances may include at least one of, for example, televisions (TVs), digital video disk (DVD) players, audios, refrigerators, air conditioners, cleaners, ovens, microwave ovens, washing machines, air cleaners, set-top boxes, TV boxes (e.g., Samsung HomeSync™, Apple TV™, or Google TV™), game consoles, electronic dictionaries, electronic keys, camcorders, and electronic picture frames.

According to various embodiments of the present disclosure, an electronic device may include at least one of various medical devices (for example, magnetic resonance angiography (MRA) devices, magnetic resonance imaging (MRI) devices, computed tomography (CT) devices, medical imaging devices, ultrasonic devices, etc.), navigation devices, global positioning system (GPS) receivers, event data recorders (EDRs), flight data recorders (FDRs), vehicle infotainment devices, marine electronic equipment (for example, marine navigation systems, gyro compasses, etc.), avionics, security equipment, car head units, industrial or household robots, financial institutions' automatic teller's machines (ATMs), and stores' point of sales (POS).

According to an embodiment of the present disclosure, an electronic device may include at least one of furniture or buildings/structures having a charging function, electronic boards, electronic signature receiving devices, projectors, or various measuring instruments (for example, water, electricity, gas, or radio signal measuring instruments). An electronic device according to an embodiment of the present disclosure may be one of the above-mentioned various devices or a combination thereof. Additionally, an electronic device according to an embodiment of the present disclosure may be a flexible device. Furthermore, it is apparent to those skilled in the art that an electronic device according to an embodiment of the present disclosure is not limited to the above-mentioned devices.

Hereinafter, an electronic device according to various embodiments of the present disclosure is described with reference to the accompanying drawings. The term "user" in various embodiments may refer to a person using an electronic device or a device using an electronic device (for example, an artificial intelligent electronic device).

FIG. 1 is a view illustrating a computing system in which an adaptor is connected to an external device according to various embodiments of the present disclosure.

Referring to FIG. 1, a computing system 200 includes various forms of electronic devices receiving power through an adaptor 100 and including external ports to which external device are connected. For example, the computing system 200 includes embodiments of notebook PCs, desktop PCs, netbook PCs, iMacs, or all-in-one PCs.

An external device 300 includes an electronic device connected to an external port of the computing system 200 and receiving power from the computing system 200. The external device 300 may be a stand-alone electronic device but is not limited thereto. The external device 300 may include various electronic devices, for example, smartphones such as Samsung Galaxy S Series, tablets such as Galaxy Tap or Note 10.1, or Galaxy Note. Additionally, the external device 300 may be a Galaxy camera or a general digital camera. According to various embodiments, the external device 300 may be a Universal Serial Bus (USB) storage device, an external hard disk, or a card reader. The external device 300 and the computing system 200 may be the same kind of a device. For example, the computing system 200 may be a laptop PC and the external device 300 also may be another laptop PC connected to an external port of the laptop PC. The computing system 200 may be connectable to an adaptor and may be a smartphone or a tablet with an external port and the external device 300 may be also the same type of another smartphone or tablet. In this specification, both the external device 300 and the computing system 200 may be denoted by or understood as an electronic device.

Although it is shown in FIG. 1 that the computing system 200 is connected to the adaptor 100 via wire and the external device 300, a connection between the adaptor 100, the computing system 200, and the external device 300 may be implemented through a wired or wireless connection. For example, the computing system 200 may supply power to the external device 300 through a wireless charging method such as a resonance induction method or an electromagnetic induction method. Although wired charging and a circuit relating thereto are mainly described in embodiments described layer, description corresponding to a configuration providing power from the computing system 200 to the external device 300 may be replaced with description corresponding to a wireless charging method within the level of those skilled in the art.

The adaptor 100 supplies power to the computing system 200. Although not shown in the drawings, the adaptor 100 may be connected to an all-time supply power (for example, alternating current (AC) power available in homes, companies or public places). The adaptor 100 may covert the all-time supply power into a form appropriate for the computing system and may then supply the power to the computing system 200. For example, when the computing system 200 is Samsung ATIV Book 9 series, the adaptor 100 may provide a rated capacity of 40 watts (W).

The computing system 200 may be driven by using a power supplied through the adaptor 100. The computing system 200 may include a battery 230. The computing system 200 may use the remaining power to charge the battery itself after supplying power to various loads (for example, a processor, a memory, a storage device, a display device (for example, an light-emitting diode (LED) or active-matrix organic light-emitting diode (AMOLED) display device), a graphic processor, a speaker, a built-in microphone, a web camera, a network module (for example, 802.11 b/g/n, Bluetooth 4.0, Ethernet module, etc.), etc.) included in the computing system 200 by using the supplied power. When power is supplied to the external device 300 connected to an external port and a spare power remains, the computing system 200 may charge the battery.

Figure 2:
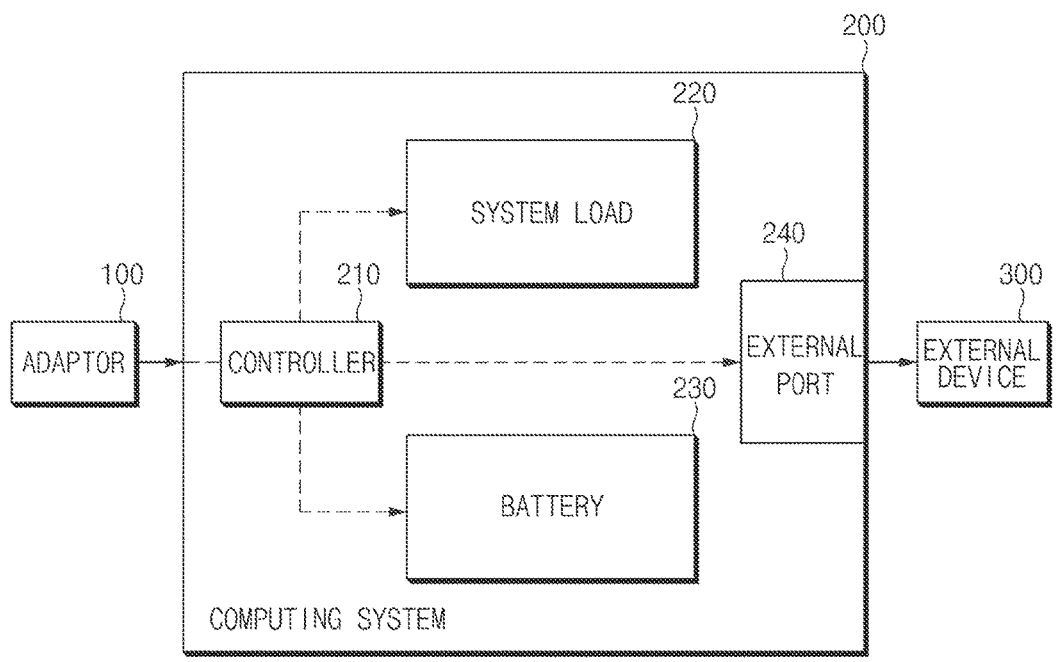
FIG. 2 is a conceptual diagram of power supply according to an embodiment of the present disclosure.

FIG. 2 is a conceptual diagram of power supply according to various embodiments of the present disclosure.

Referring to FIG. 2, the adaptor 100 supplies power to the computing system 200. The power may be supplied to a system load 220 occurring when the computing system 200. Spare power may be used to charge a battery 230 of the computing system 200. If the external device 300 is connected through the external port 240, power may be supplied to driving the external device 300 or to charge a battery built in the external device 300. According to various embodiments, the computing system 200 may distribute power in three types. One type relates to a power supplied to the system load 220 to driving the computing system 200. Another type relates to a power for charging a built-in battery 230 of the computing system 200. The last type relates to a power provided to the external device 300. A controller 210 may adjust a power distribution for the computing system 200 or the external device 300. For example, in order to prevent an error in an operation of the computing system 200 or the down of the computing system 200, the controller 210 may distribute power to the system load 220 with the highest priority. If there is a spare power, the controller 210 may supply some power to the external device 300. Power supplied to the external device 300 may be divided again into power for driving the external device 300 and power for charging a battery of the external device 300. The controller 210 may supply power for driving the external device 300 with a higher priority than power for charging a battery of the external device 300. In some embodiments, since the controller 210 (or the computing system 200) cannot control a power usage priority for the external device 300, the controller 210 may provide a control signal for using a power supplied to a controller of the external device 300 or a control unit (for example, an application processor (AP)) as a power for driving the external device 300 first. The external device 300 may use the supplied power as a power for driving the external device 300 instead of battery charging in response to the control signal. If the controller 210 provides a control signal for performing the battery charging of the external device 300 instead of the driving of the external device 300, the external device 300 may switch components (for example, an AP, and various sensors and modules) included therein into deactivation or sleep state and may focus on battery charging. However, in some other embodiments, when the controller 210 (or the computing system 200) directly controls a power usage priority for the external device 300, the controller 210 may directly control a supply path of a power supplied to the external device 300.

The controller 210 may control power supply according to various situations that occur when the external device 300 is connected. The external device 300 may support a plurality of charging states. For example, the external device 300 may support a fast charging mode, a normal charging mode, and a slow charging mode. In another embodiment, the external device may provide various charging stages. For example, a first stage (in which a minimum power necessary for driving the external device 300 is received and the battery of the external device 300 is not charged) to a fifth stage (in which an operation of the external device 300 is minimized and battery charging is maximized) may be provided. In this case, intermediate second, third, and fourth stages may be provided depending on the amount of power or current provided. In the case of the above mentioned examples (e.g., the fast/normal/low speed charging modes), it is understood that there are total three stages.

The controller 210 may determine a charging mode according to a state of the computing system 200 or the external device 300. When the external device 300 is connected to the external port of the computing system 200, the previously connected external device 300 is activated (e.g., power is ON, screen is ON, or lock is released), or the charging of the external device 300 starts through a function key or a charging command, the controller 210 may determine a charging mode by determining a possible power amount currently supplied to the external device 300. In some embodiments, when the external device 300 is connected (or other charging starts), the computing system 200 may display a screen for determining a charging mode on a screen thereof. For example, the computing system may display a menu screen for selecting one of a fast charging mode or a normal charging mode. Upon the receipt of a user input for selecting one of a plurality of charging modes from a user, the computing system 200 may determine a charging mode selected by the user as a charging mode of the external device 300. Furthermore, in some embodiments the controller 210 may automatically decide the charging mode as a fast charging mode in response to connecting with the external device 300.

The controller 210 may supply power to the external device 300 according to the determined charging mode. However, while the external device 300 is charged, it may not be desirable to continuously maintain the initially determined charging mode. For example, when the initially determined charging mode is a fast charging mode but the computing system 200 performs a task (for example, graphic task, video encoding task, large file transfer, and so forth) using a large amount of system resources (e.g., causing a heavy load for the system), power supplied to the system load 220 may become insufficient. In such a situation, the controller 210 may consume a power stored in the battery 230 but in the extreme case, due to the lack of a power supplied to the system load 220, an error in a task being performed may occur or system down may occur. Accordingly, in this case, the controller 210 may change a charging mode provided to the external device 300 from a fast charging mode into a lower mode (for example, a normal charging mode or a slow charging mode).

When the computing system 200 uses a lot of system resources or the battery 230 is nearly depleted, the controller 210 may determine a charging mode for the external device 300, for example, a slow charging mode. However, a situation that the system load 220 requires a large amount of power is released (for example, a plurality of tasks are terminated) or the charging of the battery 230 in the computing system 200 is completed or reaches a predetermined reference, a power to be provided to the external device 300 may be spared. In such a situation, the controller 210 may change a charging mode into an upper level mode (for example, a normal charging mode or a fast charging mode).

The computing system 200 may take an action for guaranteeing a charging power supplied to the external device 300. For example, the computing system 200 may supply a sufficient charging current to the external device 300 by adjusting a charging current for charging the battery 230 (for example, by reducing or cutting off a charging current of the battery 230). In some embodiments, the computing system 200 may combine a power provided by the adaptor 100 and a power provided by the battery 230 and may then provide the combined power to the external device 300. Additionally, the computing system 200 provides more than a predetermined power of a power provided by the adaptor 100 to the external device 300 and also may use a power stored in the battery 230 to allow the computing system 200 to operate normally at the same time. In this case, even when the computing system 200 is connected to the adaptor 100, the battery 230 may be discharged slowly.

Figure 3:
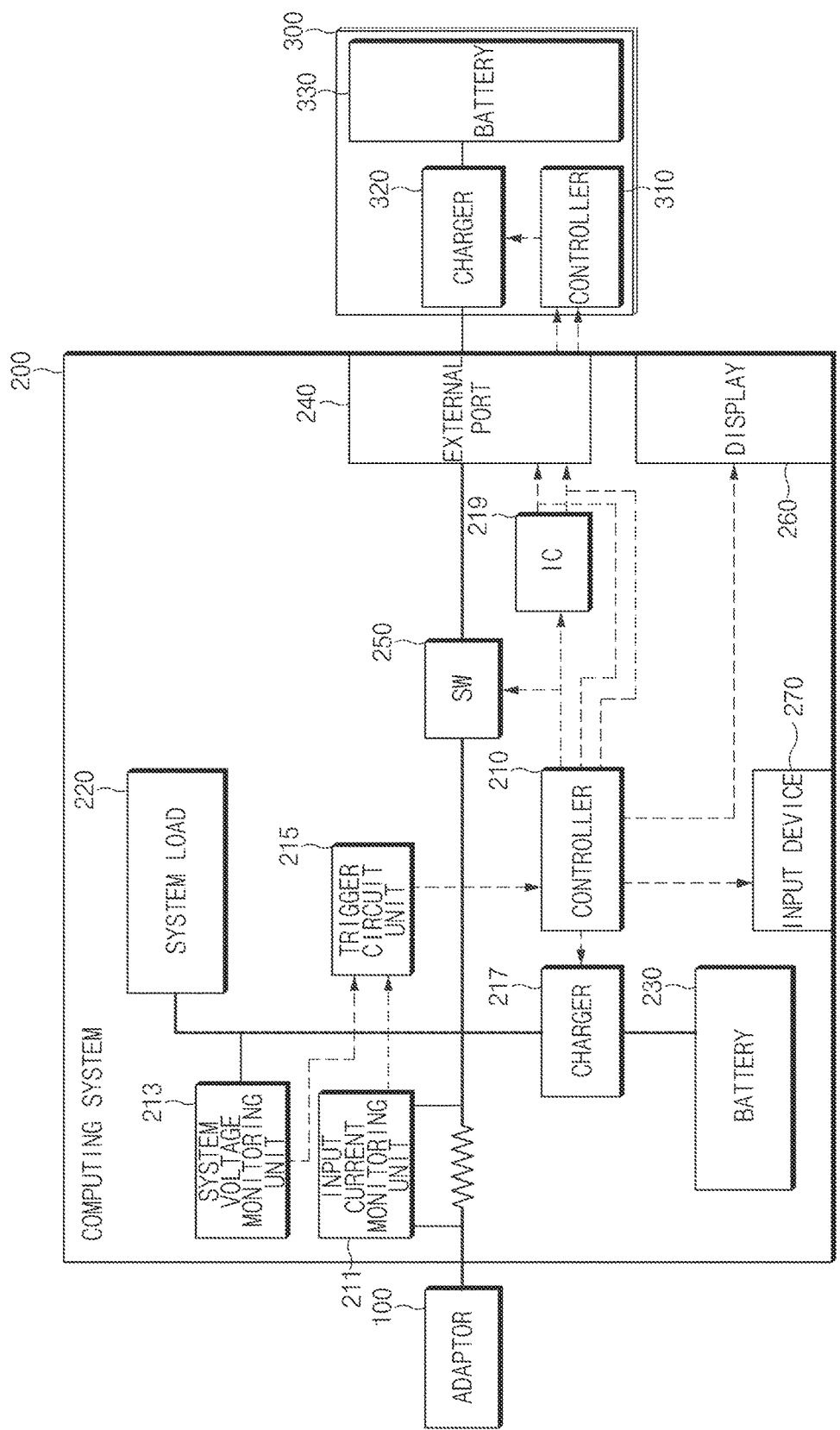
FIG. 3 is a conceptual diagram view illustrating a computing system providing a charging mode and an external device according to an embodiment of the present disclosure.

FIG. 3 is a conceptual diagram view illustrating a computing system providing a charging mode control and an external device according to various embodiments of the present disclosure.

Referring to FIG. 3, the flow of power is indicated by a bold solid line and the flow of control signal is indicated by a dotted line.

The computing system 200 may include a controller 210, a system load 220, a battery 230, an external port 240, an external port switch 250, a display 260, and an input device 270. The computing system 200 may also include an input current monitoring unit 211, a system voltage monitoring unit 213, a trigger circuit unit 215, a charger 217, and an external port current limit IC 219. Additionally, although not shown in the drawings, the computing system may further include a voltage regulator (for example, a 5V voltage regulator (VR)) disposed at the front end of the external port switch 250.

The external device 300 may include a controller 310, a charger 320, and a battery 330. Although not shown in the drawings, the external device 300 may further include a processor (for example, an AP) for driving the external device, a memory, a display, various sensors, and a module.

The controller 210 may receive a trigger signal on the basis of a monitoring result by the input current monitoring unit 211 and/or the system voltage monitoring unit 213 from the trigger circuit unit 215. The controller 210 may provide a control signal to the charger 217, the external port current limit IC 219, the external port switch 250, the display 260, and the input device 270 on the basis of at least a trigger signal. Although not shown in FIG. 3, the controller 210 may provide a control signal so as to deactivate or activate at least part of the system load 220 according to a monitoring state. The controller 210 may control an operation of the computing system 200 regardless of a trigger signal. For convenience of description, a control signal flow of the controller 210 is expressed in one direction (→), but if necessary, a control signal may be provided in a bi-direction (⇆). Additionally, the controller 210 may include a circuit therein for generating a protection alarm signal. This is described below with reference to FIG. 4.

The system load 220 may refer to a load occurring when the computing system 200 is driven, such as a component, as mentioned above. The computing system 200 may include various components and each component may require power supply to operate. The system load 220 may refer to a total sum of loads in each component required when the computing system 200 operates. In various embodiments, a component in a deactivated or sleep state is included in the computing system 200 but not included in the system load 220. For example, when an external graphics card is mounted, a graphics processing unit (GPU) included in a system is in a deactivated state and accordingly, power supply is not required. Therefore, the GPU may not be included in the system load 220. In some embodiments, when the display 260 is OFF, power is not supplied to the display 260 and thus the display 260 is excluded from the system load 220. The system load 220 may be variable.

The system load 220 may exclude components (e.g., the charger 217 and the battery 230) for charging a battery of the computing system 200 and components (e.g., the external port 240 and components of the external device 300) for supplying power to the external device 300. Additionally, although the controller 210, the display 260, and the input device 270, which are separated from a system load, are shown in FIG. 3, it may be understood that such components are included in the system load 220 from a point view of the above-mentioned description. In determining a power supplied to the system load 220 or a voltage applied to the system load 220, the influences of separately shown components may be considered together.

The battery 230 and the external port 240 are described with reference to FIG. 2 and thus their descriptions are omitted.

The external port switch 250 may serve as a switch for determining whether to connect power to the external port 240. For example, when a 5V VR is disposed at the front end of the external port switch 250, the external port switch 250 may determine whether to connect a 5V power to the external device through the external port 240. When the external device 300 is connected, the external port switch 250 may be ON automatically. When the external device 300 is connected to the computing system 200, the controller 210 may determine whether to apply power to the external device 300 and may provide an external port switch enable signal to the external port switch 250. When a high signal is applied, the external port switch 250 may be ON. When a low signal is applied, the external port switch 250 may be OFF (i.e., power supply interruption). The external port switch 250 may be controlled by software installed in the computing system 200.

When the external device 300 is connected, the display 260 may provide a screen for providing information relating to the connected external device 300 (for example, a model name, a manufacturer, supported features, a battery capacity, a current battery charging mode, and so forth) and selecting a battery charging mode of the external device 300. The display 260 may be a display equipped with a touch panel and in this case, may receive a user's touch input. Additionally, in various embodiments, the display 260 may be implemented integrated with the input device 270.

The input device 270 may receive a user input. For example, the input device 270 may include a keyboard or a mouse. The input device 270 may receive a user input for a user selection menu provided to the display 260. A charging mode selection window or menu of the external device 300 may be provided to the display 260 by a power on switch or a function key provided by the input device 270.

The input current monitoring unit 211 may monitor an input current provided from the adaptor 100. This input current may correspond to a total sum of currents supplied to the computing system 200 and the external device 300. If the external device 300 changes into a fast charging mode drastically or the system load 220 is reduced significantly, an input current may be increased. For example, a value of an input current may be increased to more than a safety reference or a reference value provided from the adaptor 100 or the computing system 200. The input current monitoring unit 211 may monitor an input current provided to the computing system 200 in such a manner and may provide a monitoring result to the trigger circuit unit 215. The input current monitoring unit 211 may convert the input current into voltage and may provide a monitoring result to the trigger circuit unit 215. In some embodiments, a process of converting an input current into voltage may be performed in the trigger circuit unit 215. This is described below with reference to FIG. 4.

The system voltage monitoring unit 213 may monitor a voltage Vsys applied to the system load 220 in order to drive the computing system 200. Due to the drastically changing system load 220, an input current (or a voltage conversion of an input current) may generate an excessive repetitive pulse near a critical value and an output corresponding thereto may serve as a factor that makes applying a detection system difficult. Accordingly, when a voltage change due to a system load change is less than a reference voltage Vth by detecting a system voltage (or, an adaptor voltage), the same adaptor limit alarm signal may occur.

The trigger circuit unit 215 may generate a trigger signal on the basis of signals provided from the input current monitoring unit 211 and the system voltage monitoring unit 213 and may than provide the trigger signal to the controller 210. The controller 210 may generate various control signals on the basis of this trigger signal and may then provide the control signals to the charger 217, the external port current limit IC 219, the external port switch 250, the display 260, and the input device 270.

The charger 217 may start charging the battery 230 when receiving a control signal for charging the battery 230 from the controller 210. In some embodiments, if there is a remaining power after power is provided to the system load 220 and the external device 300, the charger 217 may start charging the battery 230 automatically.

The external port current limit IC 219 recognizes a type of the external device 300 through a signal of the external device 300 connected to the external port 240 and may then detect and set a required charging mode (for example, a charging allowable current level and whether to communicate), such as whether to charge and communicate. The external port current limit IC 219 may provide a signal for limiting a current provided to the external device 300 or a signal for limiting a communication of the external device 300 to the external device 300 (or the controller 310 of the external device 300) on the basis of a control signal provided from the controller 210. In such a perspective view, the external port current limit IC 219 may be understood as the external port current/communication limit IC 219. For example, when a user selects a charging mode of a fast charging mode from a charging mode selection menu provided to the display 260, the external port current limit IC 219 may provide a control signal for allowing the external device 300 to operate in a state appropriate for fast charging, to the controller 310. For example, the controller 310 may stop a data communication (and a communication between the external device 300 and another external device or a server) between the computing system 200 and the external device 200 and may then start fast charging after activating a minimum function of the external device 300. Some of the above-mentioned operations (for example, data communication interruption) may be performed by the computing system 200 (or the controller 210).

The external device 300 may be connected to the computing system 200 through the external port 240. The controller 310 of the external device 300 may adjust a setting of the external device 300 in response to a control signal provided from the computing system 200. For example, when charging is performed in fast charging mode, the controller 310 may limit data communication or may switch an AP of the external device 300 into a sleep state. When the external device 300 is charged in slow charging mode, the controller 310 may allow most of the supplied power to be used for driving the external device 300. In each case, the charger 320 may provide a supplied power to the battery 330 so as to charge the battery 330.

Figure 4:
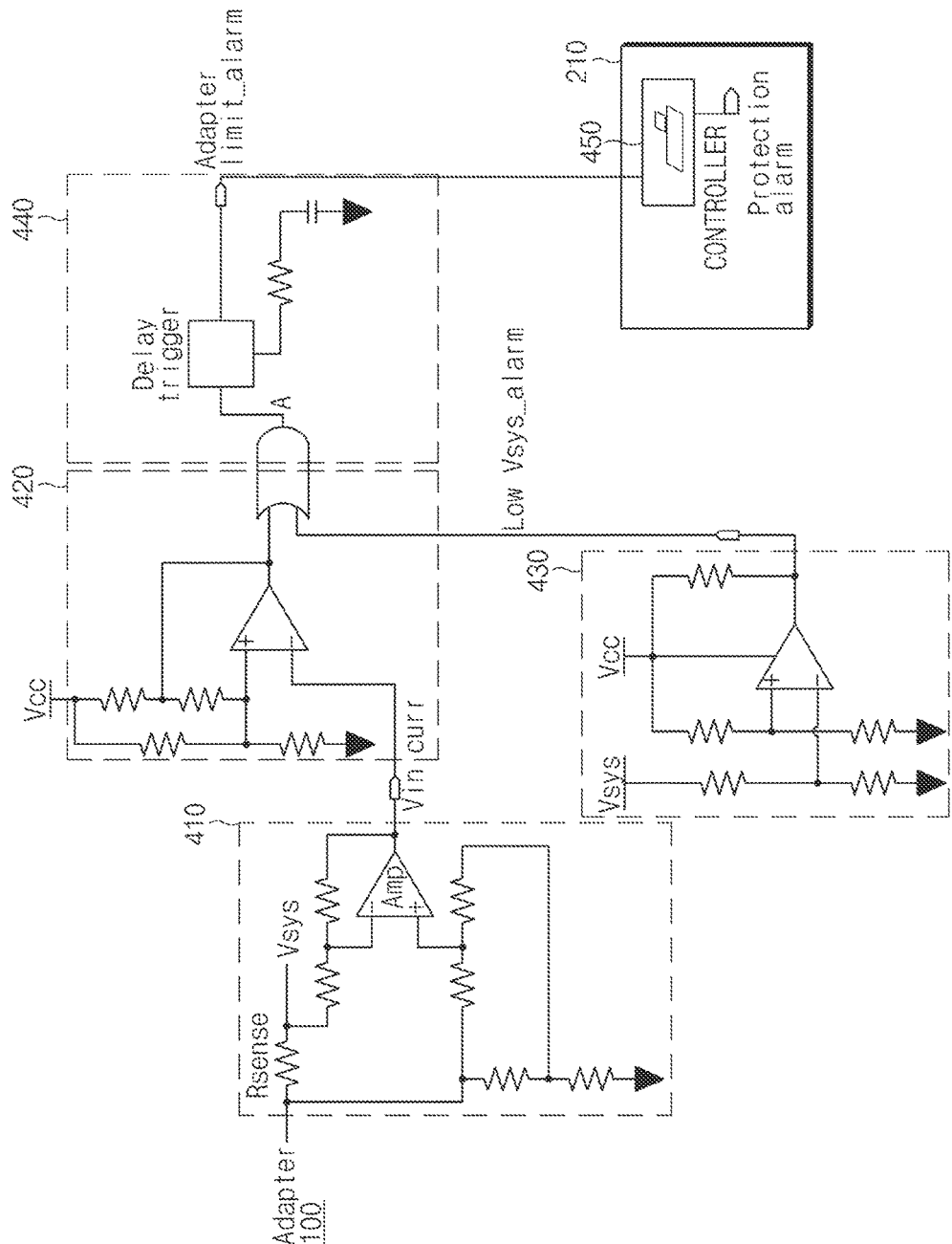
FIG. 4 is a view of a control circuit according to an embodiment of the present disclosure.

FIG. 4 is a view of a control circuit according to various embodiments of the present disclosure.

Referring to FIG. 4, the control circuit includes the input monitoring unit 211, the system voltage monitoring unit 213, the trigger circuit unit 215, and the controller 210, all of which are shown in FIG. 3. For example, a circuit 410, a circuit 430 may correspond to the input current monitoring unit 211 and the system voltage monitoring unit 213, respectively. Circuits 420 and 440 correspond to the trigger circuit unit 215. The circuit may convert an input current into voltage.

A sense resistor Rsense having one end connected to the adaptor 100 and the other end connected to a system voltage may be disposed in the circuit 410. The circuit 410 may detect an input voltage inputted from the adaptor 100 by using the sensor resistor Rsense and may then convert the detected input voltage into voltage so as to output the voltage as an output voltage Vin_curr. The circuit 420 may determine whether the output voltage Vin_curr exceeds a threshold voltage Vth. A determination result may be provided to an OR gate A.

The circuit 430 may determine whether the system voltage Vsys is below a reference voltage. When the system voltage Vsys is below the reference voltage, the computing system 200 may not operate normally and thus an alarm may be required. A result determined by the circuit 430, for example, Low Vsys alarm signal, may be provided to the OR gate A. A control circuit according to various embodiments of the present disclosure may have a structure for checking whether an adapter capacity is exceeded accurately through a parallel configuration of an input current (i.e., an adaptor current) and an input voltage (i.e., a system voltage).

The circuit 440 (that is, the trigger circuit unit 440) may generate a trigger on the basis of a signal provided to the OR gate A. The trigger may be an adaptor limit alarm signal representing that a voltage or current value reaches a limit value of the adaptor 100.

The adaptor limit alarm signal may occur each time an alarm signal is provided to the OR gate A, but may be provided with a delay in some embodiments. For example, R, L (not shown), and C devices in the circuit 440 (are used to adjust a delay time. For example, in the case that the delay time is t1, when an adaptor limit alarm signal occurs and when a signal corresponding to a threshold current or a reference voltage is provided before the time t1 elapses, the trigger circuit unit 440 may not generate an adaptor limit alarm signal. A situation in which a charging mode of the external device 300 is changed continuously when many alarm signals occur within a short time through such a delay (e.g., a situation in which as soon as a normal charging mode changes into a fast charging mode, the fast charging mode changes into the normal charging mode again is repeated, or the reverse situation is repeated) may be prevented.

The controller 210 may include a circuit 450 for generating a protection alarm signal. The circuit 450 may generate a protection alarm signal when an adaptor limit alarm signal occurs more than a predetermined number of times within a reference time (e.g., t2). This is because instantaneous voltage or current abnormality may occur inside a circuit (e.g., phenomena such as induced electro motive force and induced current occurring when a switch is ON/OFF or the external device 300 is connected or disconnected) and it may not be appropriate to change a charging mode by one or a small number of adaptor limit alarm signals. Accordingly, when an occurrence period or an occurrence frequency of an adaptor limit alarm signal satisfies a condition predefined according to a situation of the computing system 200, the circuit 450 may generate a protection alarm signal and the controller 210 may change a charging mode in response to the protection alarm signal. In various embodiments, when a protection alarm signal occurs, the controller 210 may adjust a charging mode to lower a current stage by one stage. However, in some embodiments, the controller 210 may adjust a charging mode to an arbitrary lower stage in response to a protection alarm signal.

A control circuit according to an embodiment of the present disclosure may include a voltage cumulative comparator. When an input current (for example, a conversion voltage of an input current), an adaptor limit alarm signal, or a voltage level in the OR gate A are accumulated and a voltage more than a specific voltage occurs, high or low may be maintained and when an accumulated voltage level is maintained more than a specific level, the voltage cumulative comparator may change a charging mode at a corresponding point.

Additionally, when a battery discharging mode is supported together with an adaptor input during high power, a charging mode may be changed (for example, from fast charging mode to slow charging mode) through a remaining Relative State of Charge (RSOC) change amount of the battery 330 of the external device 300. For example, the controller 210 may monitor the RSOC of the battery 330 in the external device 300 periodically or continuously. The controller 210 may change a charging mode on the basis of a change amount of the monitored RSOC. In general, when a battery is discharged completely or the remaining battery is running low, charging may be performed at a fast speed but as a battery reaches an almost full charging state, a charging speed may be reduced. Accordingly, it may be efficient to change a charging speed according to a remaining battery level. When a charging mode changes, an alarm may be provided to the display 260. If a user wants to re-enter a fast charging mode, a selection menu may be provided. In some embodiments, when a battery is being charged, a method for changing a charging mode at all times or by a predetermined input may be displayed on a display of the computing system 200 or the external device 300. In some embodiments, when an RSOC change amount is increased, the mode changes into a fast charging mode automatically.

Figure 5:
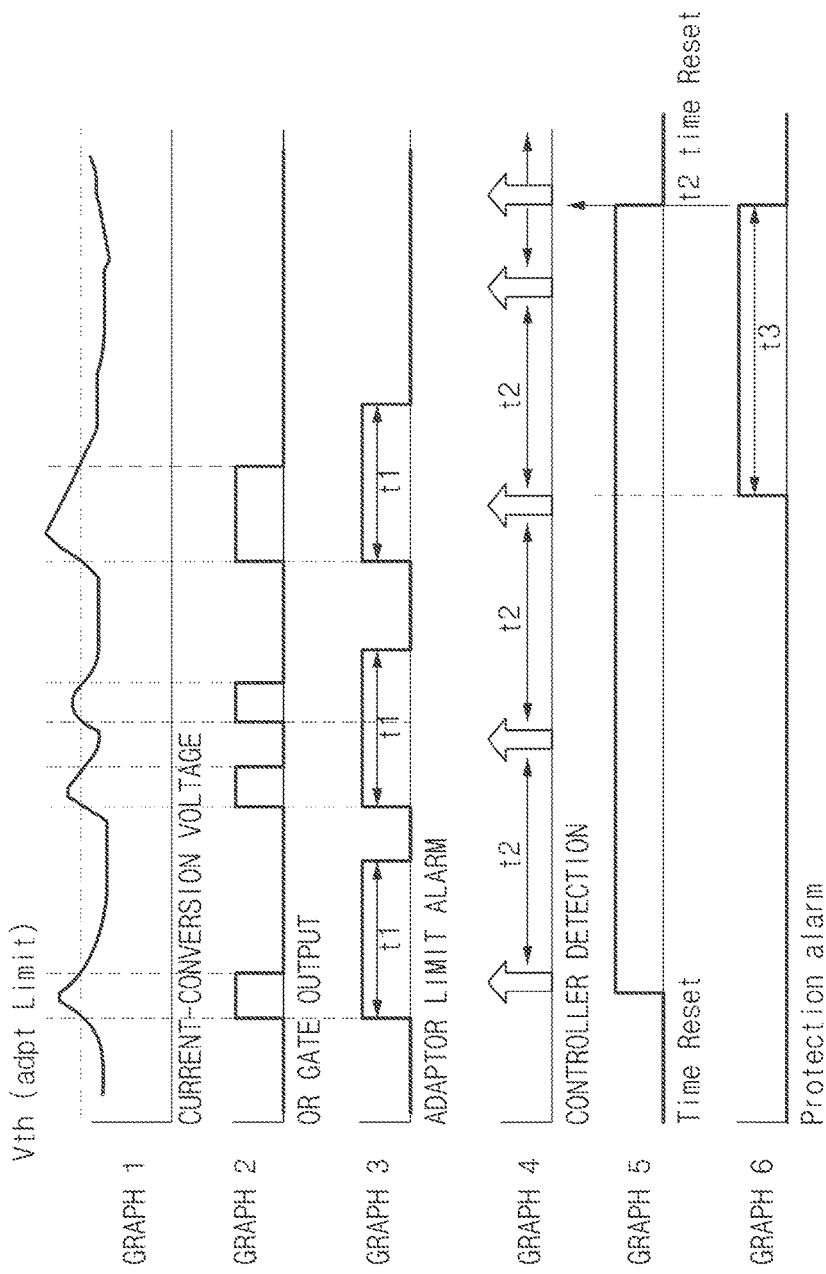
FIG. 5 is a view illustrating a timing relationship of an alarm signal occurring in each circuit according to an embodiment of the present disclosure.

FIG. 5 is a view illustrating a timing relationship of an alarm signal occurring in each circuit according to various embodiments of the present disclosure.

Referring to FIG. 5, Graph 1 represents a change in monitored input current (a value changed into voltage). When an input current is converted into voltage, Vth may represent a threshold voltage. Each time a threshold voltage occurs, a high signal may be generated in the OR gate A. The OR gate A may output a high signal (see Graph 2) in response to a monitoring result for system voltage Vsys (for example, the system voltage Vsys lower than a reference voltage is detected) in addition to a monitoring result for input current.

Referring to Graph 3, an adaptor limit alarm signal occurring in the trigger circuit unit 215 (or the circuit unit 440) may be generated for a predetermined time t1. Even when several times of a voltage of more than a threshold voltage or less than a reference voltage occurs from the OR gate A within the predetermined time t1, several alarm signals occurring during the predetermined time t1 may be provided as one adaptor limit alarm signal.

Referring to Graph 4, the controller 210 may detect an adaptor limit alarm signal occurring by the trigger circuit unit 215 at an interval of a predetermined time (for example, t2). The controller 210 detects the number of times that an adaptor limit alarm signal is maintained high at an interval of a predetermined time t2 and when a high signal occurs more than a predetermined number of times, for example, the circuit 450 may generate a protection alarm signal (for example, high).

Referring to Graph 5, t2 may be counted as soon as an adaptor limit alarm high signal is detected first during one period. When the protection alarm occurs, after a predetermined time t3 elapses, t2 may be initialized again.

Referring to Graph 6, when an adaptor limit alarm signal is detected more than a predetermined number of times (e.g., three times as shown in Graph 6), the circuit 450 may generate a protection alarm signal. When a protection alarm signal occurs, a charging mode may be changed to a lower stage. For example, a charging mode may be changed, for example, from a fast charging mode into a normal charging mode or a slow charging mode.

A protection alarm signal may last for t3. In some cases, an input current may exceed an allowable value or a system voltage may be still detected low, even though the charging mode has changed. In this case, a signal detected during t3 may be ignored. Too frequent changes in a charging mode may be inefficient or may inconvenience the user. As t3 elapses, t2 is reset and an entire monitoring process of the computing system 200 may start again.

Figure 6:
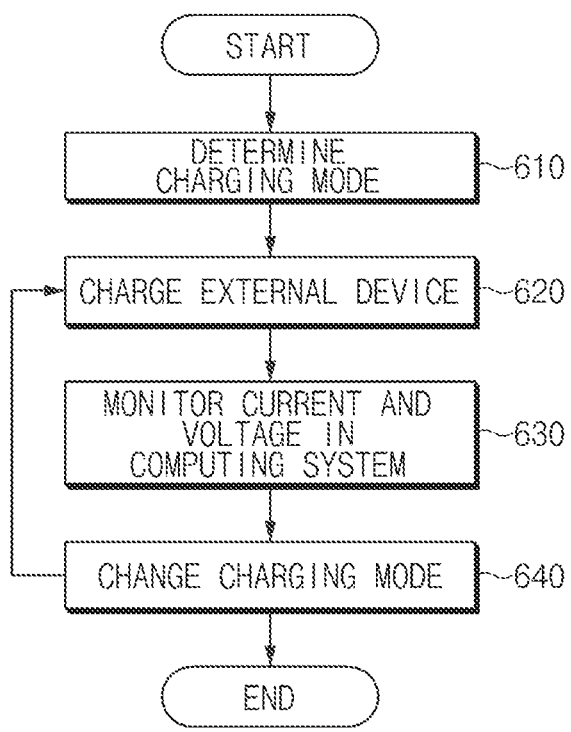
FIG. 6 is a view illustrating a process for changing a charging mode of an external device according to an embodiment of the present disclosure.

FIG. 6 is a view illustrating a process for changing a charging mode of an external device according to various embodiments of the present disclosure.

Referring to FIG. 6, a charging mode of an external device 300 may be determined in operation 610. When the external device 300 is connected to a computing system 200, the computing system 200 may charge the external device through a predefined general charging mode (for example, a power supply of 5V to 0.5 A). In some embodiments, the computing system 200 may determine a charging mode on the basis of at least one characteristic of the external device 300, the current load of the computing system 200, and the remaining battery power amount of the battery 230 in the computing system 200. In some embodiments, when the external device 300 is connected or a specific input relating to charging occurs from a user, the computing system 200 may display a menu for determining a charging mode. A charging mode may be determined on the basis of a user input for the displayed menu.

In operation 620, the computing system 200 may start charging the external device 300 according to the determined charging mode. As the charging starts, the computing system 200 may provide information on the current charging mode, another charging mode that a user can change, or voltage or current that is currently supplied.

In operation 630, the computing system 200 may monitor current and voltage therein. For example, the computing system 200 may monitor an input current provided from the adaptor 100. The input current may be monitored with a value converted to voltage. Additionally, the computing system 200 may monitor whether a sufficient voltage required for a system load is applied to drive the computing system 200 stably.

In operation 640, if a monitoring result input current is too high or a system voltage of less than a reference value is detected, a charging mode may be changed. For example, the charging mode may be adjusted one stage down from the fourth stage to the third stage. Once the charging mode is changed, the process proceeds to operation 620 again and continuously charges the external device 300. When charging the external device 300 is completed, the process is terminated.

Figure 7:
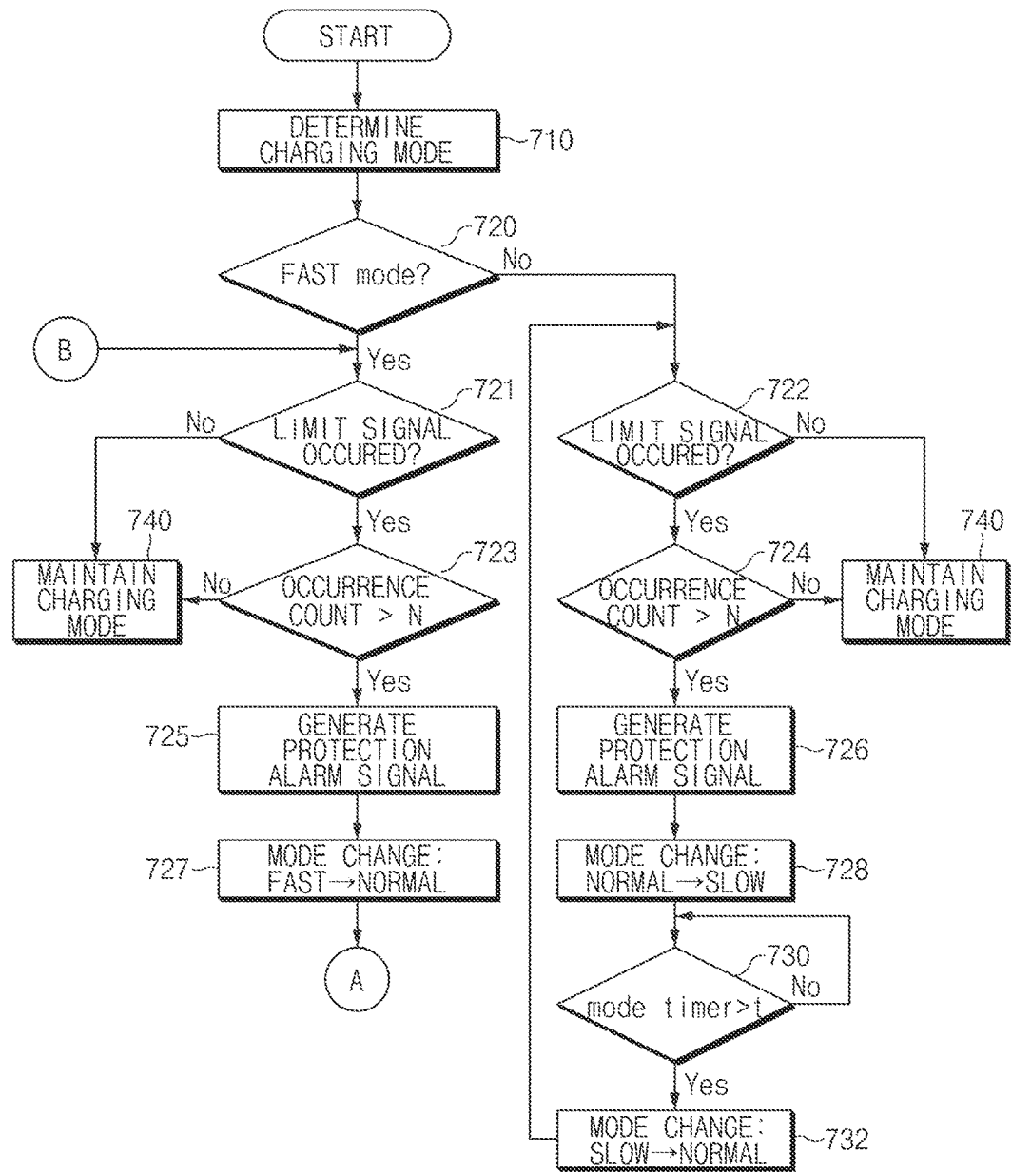
FIG. 7 is a view illustrating a part of a process according to an embodiment of the present disclosure.

FIG. 7 is a view illustrating a part of a process for changing a charging mode of an external device according to various embodiments of the present disclosure.

Referring to FIG. 7, a charging mode may be determined in operation 710. Operation 710 may include an operation for displaying a selectable charging mode to a user and an operation for determining a charging mode selected on the basis of a user input as a charging mode. For example, a fast charging mode and a normal charging mode may be provided as a user selectable charging mode. According to an embodiment of the present disclosure, a part of a charging mode supported by the computing system 200 may be provided to be selected by a user. For example, a slow charging mode may be supported by the computing system 200 but may not be provided in a user selection menu.

In operation 720, it is determined whether the determined charging mode is the fast charging mode. If the determined charging mode is the fast charging mode, the process proceeds to operation 721 and if the determined charging mode is the normal charging mode, the process proceeds to operation 722.

In operation 721, it is be determined whether a limit signal occurs. In various embodiments, the limit signal may be an adaptor current limit alarm signal generated based on a current (or a converted voltage) detected by the input current monitoring unit 211 or a voltage detected by the system voltage monitoring unit 213. When the limit signal occurs, the process proceeds to operation 723 but when the limit signal is not detected, the process proceeds to operation 740.

In operation 723, the number of occurrences of the limit signal, for example, an adaptor current limit alarm signal, may be determined. The number of occurrences may indicate the number of adaptor current limit alarm signals occurring during a second time period (for example, a time period t3) at a first time interval (for example, a time interval t2). If the number of occurrences exceeds the predefined reference number of occurrences N (for example, N=3), the process proceeds to operation 725. If not, the process proceeds to operation 740.

In operation 725, the number of occurrences of an adaptor current limit alarm signal exceeds the predetermined reference number of occurrences N, a protection alarm signal may occur. The protection alarm signal may be generated by a protection alarm signal generation circuit 450 disposed in the controller 210. When the protection alarm signal occurs, the process proceeds to operation 727.

In operation 727, the computing system 200 may change a charging mode of the external device 300. The fast charging mode that is the current charging mode may be changed into the normal charging mode that is one stage down. After the charging mode is changed, the process may proceed to A continuously. Subsequent operations are described below with reference to FIG. 8.

In operation 720, when the charging mode is not the fast charging mode (that is, in the case of the normal charging mode), the charging mode is monitored in operation 722 whether a limit signal occurs. Additionally, the number of occurrences of the limit signal is determined in operation 724. Since operations 722 and 724 correspond to operations 721 and 723, respectively, overlapping descriptions are omitted.

In operation 726, when the number of occurrences of an adaptor current limit alarm signal exceeds the predetermined reference number of occurrences N, a protection alarm signal may occur.

In operation 728, the computing system 200 may change the charging mode of the external device 300. The normal charging mode that is the current charging mode may be changed into the slow charging mode that is the lowest stage. When the charging mode is changed, a charging mode timer may operate.

In operation 730, it is determined whether a predetermined time t elapses after the time that the charging mode is changed. When the time t elapses, the process proceeds to operation 732. In the embodiment of FIG. 7, since the charging mode changed in operation 728 is the lowest stage charging mode, a monitoring operation for detecting the occurrences of an additional protection alarm signal may not be performed.

In operation 732, when it is determined in operation 732 that the time t elapses, the current charging mode is changed to a charging mode determined in operation 710 (i.e., from the slow charging mode into the normal charging mode). When the charging mode determined by a user is the normal charging mode, the computing system 200 may perform charging in the slow charging mode for a predetermined time t (for example, 30 min) and may then change the charging mode into the normal charging mode that is initially selected by a user again. When the charging mode is changed into a higher charging mode again, the computing system 200 may perform operations for monitoring the occurrence of a protection alarm signal again (e.g., operation 722 to operation 726). When a limit signal does not occur or the reference number of occurrences is not exceeded, a currently determined charging mode may be maintained in operation 740.

Figure 8:
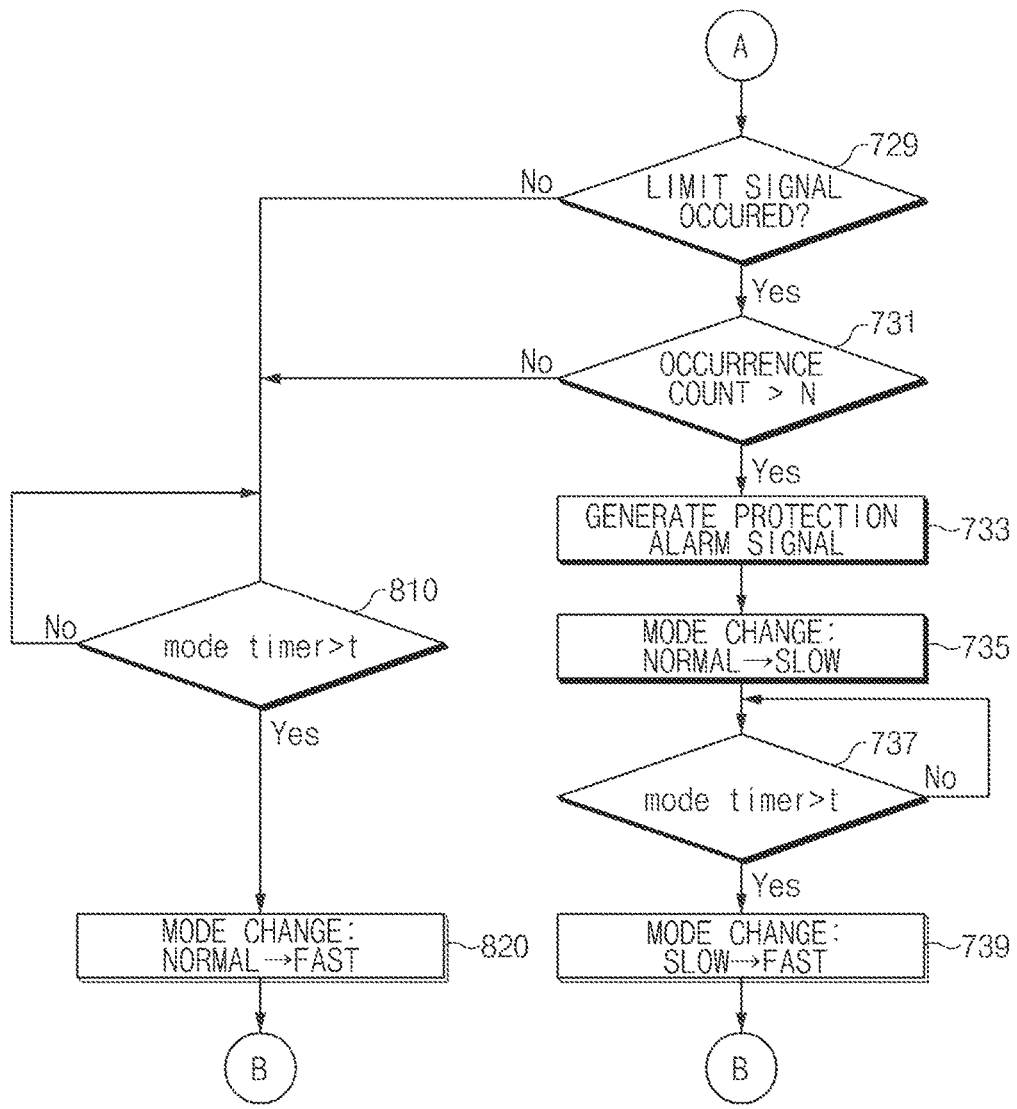
FIG. 8 is a view illustrating a process for changing a charging mode of an external device according to an embodiment of the present disclosure.

FIG. 8 is a view illustrating a process for changing a charging mode of an external device according to an embodiment of the present disclosure.

Referring to FIG. 8, in operation 729, whether a limit signal occurs is monitored. Additionally, the number of occurrences of the limit signal is determined in operation 731. Since operations 729 and 731 correspond to operations 721 and 723, respectively, overlapping descriptions are omitted.

When a limit signal does not occur in operation 729 or the number of occurrences of a limit signal is less than a predetermined number N in operation 731, the process proceeds to operation 810.

In operation 810, it is determined whether a time t elapses after the time that the mode changes into the normal charging mode. When it is determined that the time t elapses, the current charging mode is changed to the charging mode determined in operation 710 (i.e., from the normal charging mode into the fast charging mode). When the charging mode determined by a user is the fast charging mode, the computing system 200 may perform charging in the normal charging mode for a predetermined time t (for example, 30 min) and may then change the charging mode into the normal charging mode that is initially selected by a user again. In operation 810, for example, the time t for performing charging in the normal charging mode may be identical to or different from the time for performing charging in the slow charging mode in operation 730. For example, after charging is performed for 20 min in the normal charging mode, it is possible to attempt to change the mode into the fast charging mode. The mode timer t according to a charging mode may be set arbitrarily in a system or defined by a user.

When the charging mode is changed into the fast charging mode again in operation 820, the process may proceed to B and may then perform operations for monitoring the occurrence of a protection alarm signal again (for example, operation 721 to operation 725). When a limit signal does not occur or the reference number of occurrences is not exceeded, a currently determined charging mode may be maintained in operation 740.

When the number of occurrences of a limit signal exceeds a predetermined number N in operation 731, the process proceeds to operation 733.

In operation 733, a protection alarm signal may occur. When the protection alarm signal occurs, the process proceeds to operation 735.

In operation 735, the computing system 200 may change a charging mode of the external device 300. The normal charging mode that is the current charging mode may be changed into the slow charging mode that is the lowest stage. When the charging mode is changed, a charging mode timer may operate.

In operation 737, it is determined whether a predetermined time t elapses from the time that the charging mode is changed. When the time t elapses, the process proceeds to operation 732. Operation 737 of FIG. 8 may correspond to operation 730 of FIG. 7.

In operation 739, when it is determined in operation 732 that the time t elapses, the current charging mode is changed to a charging mode determined in operation 710 (i.e., from the slow charging mode into the fast charging mode). In this case, since the charging mode determined by a user is the fast charging mode, the computing system 200 may perform charging in the slow charging mode for a predetermined time t (for example, 30 min) and may then change the charging mode into the fast charging mode that is initially selected by a user again. In this embodiment, a charging mode may be changed from the lowest charging mode to the highest charging mode directly without going through the normal charging mode that is an intermediate stage. After the charging mode is changed, the process may proceed to B (operation 721).

Figure 9:
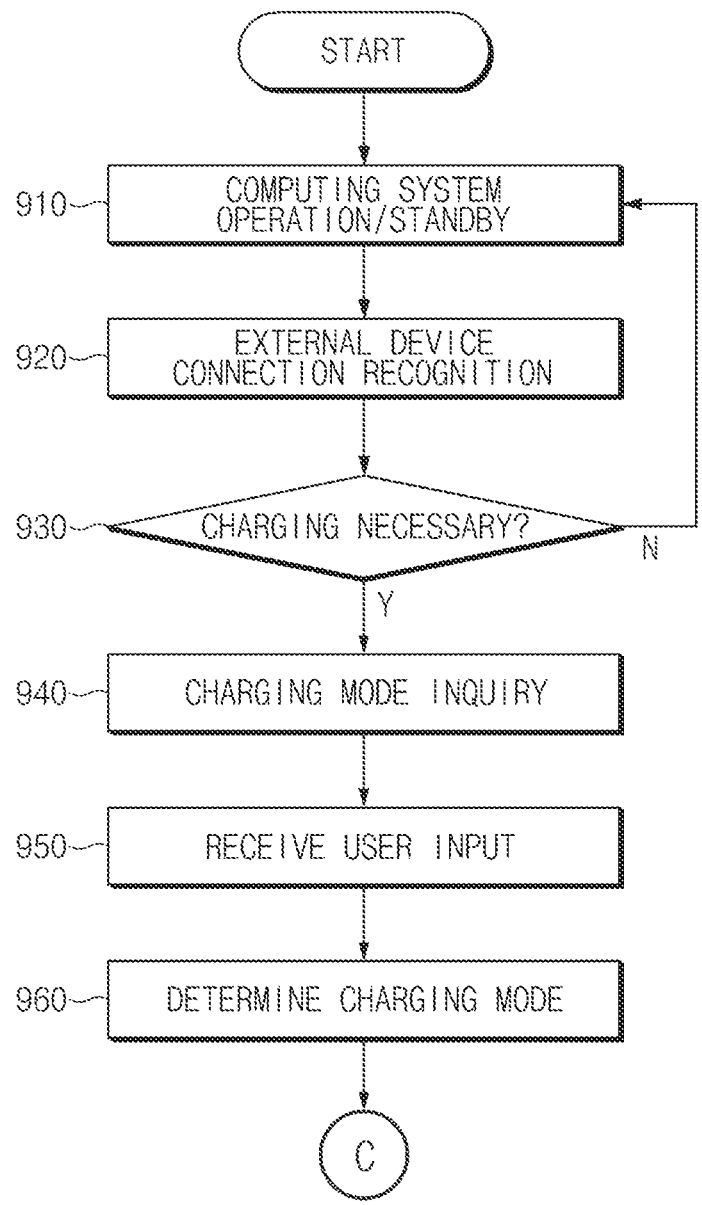
FIG. 9 is a view illustrating a process for determining a charging mode on the basis of a user input according to an embodiment of the present disclosure.

FIG. 9 is a view illustrating a process for determining a charging mode on the basis of a user input according to various embodiments of the present disclosure.

Referring to FIG. 9, the computing system 200 may perform a specific task or may be in a standby state in operation 910. For example, the computing system 200 may be in a power saving mode.

In operation 920, the computing system 200 may recognize that the external device 300 is connected. In correspondence to the connection recognition, the computing system 200 may change the external port switch 250 to be in the ON state. Additionally, in communication with the external device 300 through the external port current limit IC 219, information on the external device 300 may be received. The connection recognition may occur when the external device 300 is connected physically, the power of an already connected external device is activated in ON state, or connection is established on software or circuit. For example, a user may recognize the external device 300 that is already connected physically by using a function key of the input device 270, through a software manner.

In operation 930, it is determined whether charging of the external device 300 is necessary. When it is determined in operation 930 that the charging is required, the process proceeds to operation 940. When the charging of the external device 300 is not required, the process returns to operation 910 so that the computing system 200 may enter a normal function performance or a standby state.

When the charging is required in operation 940, the computing system 200 may provide an inquiry for a charging mode. For example, the computing system 200 may display a user selectable charging mode on the display 260 of the computing system 200. All charging modes that the computing system 200 supports or only some of a plurality of charging modes may be provided to the display 260. In some embodiments, an inquiry for a charging mode may be provided to a display of the external device 300. In this case, the controller 210 may provide a charging mode that the computing system 200 can support to the controller 310 of the external device 300 and the controller 310 may determine a charging mode that the external device 300 can accept to provide the charging mode to the display of the external device 300.

In operation 950, a user input for an inquiry of a charging mode may be received. When a selection menu of a charging mode is provided from the external device 300, the external device 300 may receive an input for a charging mode to provide to the controller 210 of the computing system 200.

In operation 960, the computing system 200 may determine a charging mode on the basis of a user input. When the charging mode is determined, the computing system 200 may charge the external device 300 according to the determined charging mode and may perform an operation for monitoring the current and voltage of the computing system 200 during charging. A process C may correspond to operation 630 of FIG. 6 and operations 721 to 727 of FIG. 7.

Figure 10:
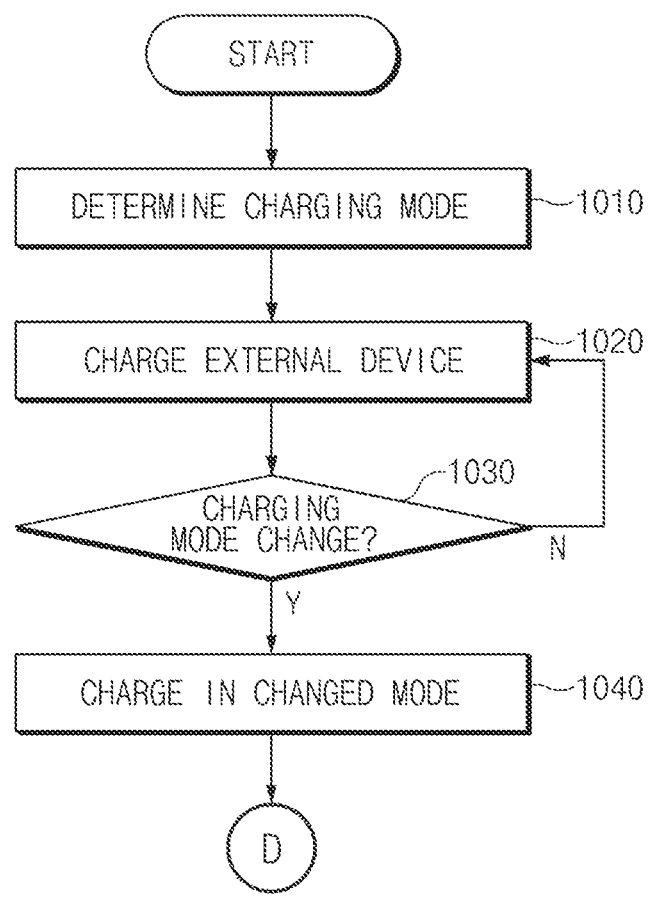
FIG. 10 is a view illustrating a process for changing a charging mode by a user input during charging of an external device according to an embodiment of the present disclosure.

FIG. 10 is a view illustrating a process for changing a charging mode by a user input during charging of an external device according to various embodiments of the present disclosure.

Referring to FIG. 10, a charging mode of an external device 300 may be determined in operation 1010. In operation 1020, charging the external device 300 is performed. While the external device 300 is performed, information on the current charging mode of the external device 300, for example, information on provided voltage, provided current, and another charging mode, may be provided. In some embodiments, a selection menu, a graph, or a scroll for a charging current supported by the external device 300 may be provided.

In operation 1030, a user may change a charging mode. For example, a user may select a charging mode faster or slower than the current charging mode. In some embodiments, a user may select an arbitrary charging current within a charging current range supported by the external device 300.

In operation 1040, the computing system 200 may charge the external device 300 according to a charging mode changed by a user input. The computing system 200 may monitor the current or voltage therein while charging the external device 300 through the changed charging mode. A process D may correspond to operation 630 of FIG. 6, operations 721 to 727 of FIG. 7, and the process C of FIG. 9.

Figure 11:
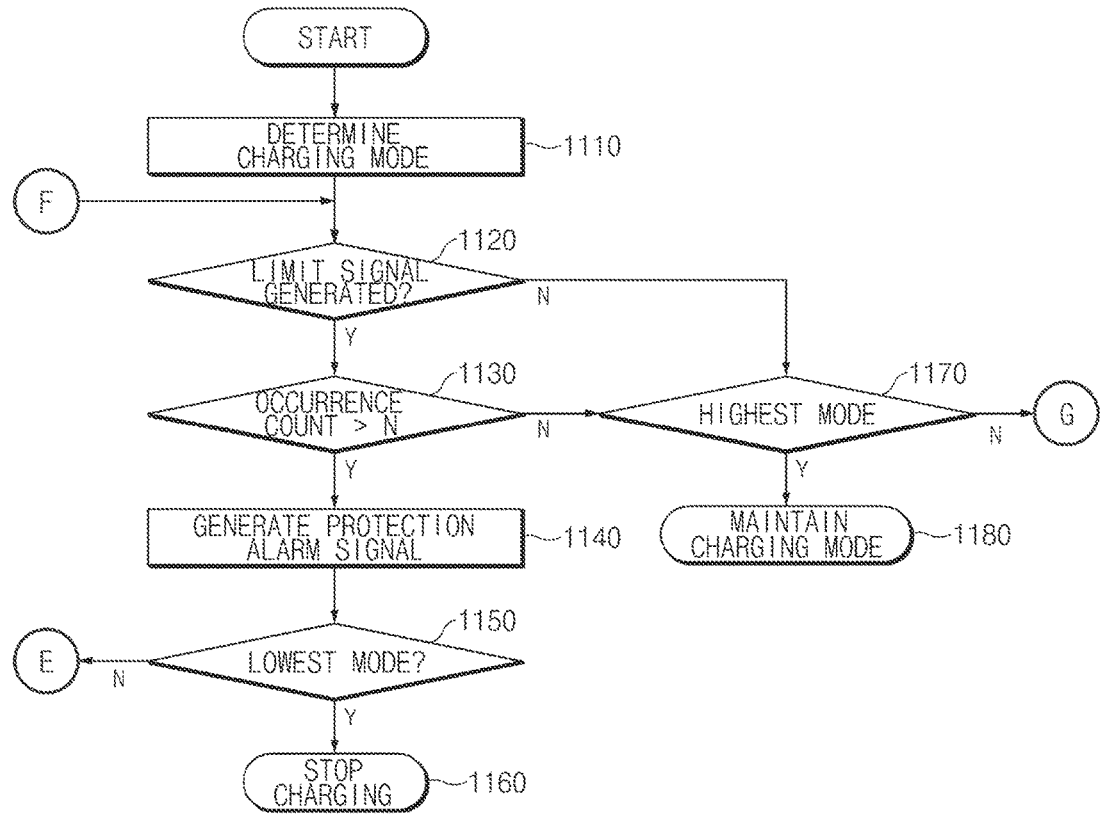
FIG. 11 is a view illustrating a part of a typical process for controlling a charging mode of an external device according to an embodiment of the present disclosure.

FIG. 11 is a view illustrating a part of a process for controlling a charging mode of an external device according to an embodiment of the present disclosure. In relation to the description below, overlapping content is omitted. In the description relating to the above-mentioned flowchart, device and circuit, applicable descriptions may be applied to FIGS. 11 and 12.

Referring to FIG. 11, a charging mode may be determined in operation 1110. In operation 1120, whether a limit signal (for example, an adaptor limit alarm signal) occurs may be determined. In operation 1130, whether the number of occurrences of a limit signal exceeds a predetermined number N may be determined.

When the limit signal does not occur or the number of occurrences does not exceed a predetermined number N in operation 1120, the process proceeds to operation 1170. In operation 1170, it is determined whether the current charging mode is the highest charging mode (for example, the fast charging mode). When the current charging mode is the highest charging mode, the process proceeds to operation 1180 and when the current charging mode is not the highest charging mode, the process proceeds to a process G.

When the limit signal does not occur or the number of occurrences does not exceed a predetermined number N in operation 1120, this means that a charging state of the current computing system 200 is extremely good. The computing system 200 may consume fewer system resources=, the battery 230 of the computing system 200 may be completely charged, or a battery status of the external device 300 may be good. In such a case, the computing system 200 may supply more charging current to the external device 300. However, when the current charging mode is the highest charging mode, (i.e., the most current that the computing system 200 or the external device 300 supports is supplied), the charging mode may be maintained as is. If the current charging mode is not the highest charging mode, the process proceeds to a process G to change the charging mode to a higher charging mode.

The process returns to operation 1130 again and when the number of occurrences of a limit signal exceeds the predetermined number N, a protection alarm signal may occur in operation 1140. When a protection alarm signal occurs, it is determined in operations 1150 whether the current charging mode is the lowest charging mode (for example, the slow charging mode). If the current charging mode is not the lowest charging mode, the process proceeds to a process E to change the charging mode into a one stage lower charging mode. If the current charging mode is the lowest charging mode, this means that there is a limit situation in the computing system 200 or the adaptor 100 when the lowest charging mode is used. Therefore, the charging of the external device 300 may be stopped in operation 1160.

Figure 12:
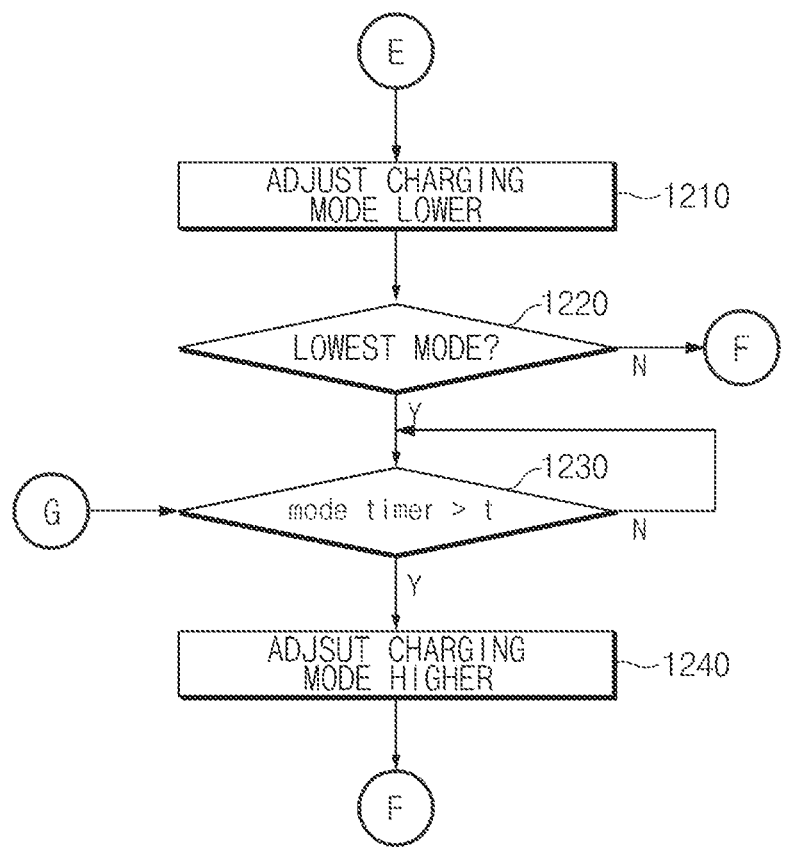
FIG. 12 is a view illustrating a following process for controlling a charging mode of an external device according to an embodiment of the present disclosure.

FIG. 12 is a view illustrating a process for controlling a charging mode of an external device according to an embodiment of the present disclosure.

Referring to FIG. 12, it is determined whether a predetermined time t elapses after charging starts through the current charging mode in operation 1230. If the predetermined time t elapses, the process proceeds to operation 1240.

In operation 1240, the current charging mode may be adjusted to a one stage higher charging mode. However, when there is a charging mode set by a user as shown in the embodiments of FIGS. 7 and 8, the charging mode may be adjusted higher to one among a plurality of higher charging modes.

When the current charging mode is not the lowest charging mode in operation 1150 of FIG. 11, the process proceeds to a process E. A charging mode may be adjusted lower in operation 1210. In operation 1220, it is determined whether the changed charging mode is the lowest charging mode. If the lowered charging mode is the lowest charging mode, it is determined in operation 1230 whether a predetermined time t elapses. If the predetermined time t elapses from the time that the charging mode is changed, the charging mode is adjusted higher in operation 1240. However, when the lowered charging mode is not the lowest charging mode in operation 1220, the process proceeds to a process F to monitor the current and voltage of the computing system 200. This may partially correspond to the embodiments of FIGS. 7 and 8.

However, according to some embodiments, a monitoring operation may be performed between operation 1220 and operation 1230. As described with reference to FIG. 11, when the changed charging mode is the lowest charging mode, a monitoring operation is performed and while the external device 300 is charged through the lowest charging mode, if a protection alarm signal occurs, the charging may be stopped.

A charging control method of a computing system according to various embodiments of the present disclosure may include an operation for determining a charging mode for an external device connected to the computing system, an operation for charging the external device according to the charging mode, an operation for monitoring a current and a voltage in the computing system, and an operation for changing the charging mode on the basis of the monitoring result.

An operation for determining a charging mode according to various embodiments of the present disclosure may include an operation for presenting a plurality of selectable charging modes to a user, an operation for receiving a user input for selecting one of the plurality of charging modes, and an operation for determining the selected mode as the charging mode. Additionally, the operation for determining the charging mode may determine a charging mode automatically on the basis of at least one of a system load of the computing system, a battery charging condition included in the computing system, and an operating state of the external device. Additionally, the operation for determining the charging mode may include an operation for presenting a selectable range of a charging current to a user, an operation for receiving a user input for a specific current value corresponding to the range of the charging current, and an operation for determining a charging mode according to the specific current value on the basis of the received user input.

The operation for monitoring the voltage and current according to various embodiments of the present disclosure may include at least one of an operation for monitoring an input current by an adaptor that is electrically connected to the computing system and supplying power to the computing system or an operation for monitoring a system voltage of the computing system. Additionally, the operation for monitoring the voltage and current may include at least one of an operation for monitoring an input current by an adaptor that is electrically connected to the computing system and supplying power to the computing system or an operation for monitoring a system voltage of the computing system.

The operation for changing the charging mode according to various embodiments of the present disclosure may include an operation for changing the charging mode into a lower stage changing mode when the number of cases that the current exceeds a reference current value or the voltage is less than a reference voltage is more than a predefined number. Additionally, the operation for changing the charging mode may include an operation for changing the charging mode into a higher stage changing mode when cases that the current exceeds a reference current value or the voltage do not occur for a predetermined time.

The operation for monitoring the input current according to various embodiments of the present disclosure may include an operation for converting the input current into voltage and an operation for monitoring whether the converted voltage exceeds a threshold voltage.

The operation for monitoring the system voltage according to various embodiments of the present disclosure may include an operation for monitoring whether the system voltage is less than a reference voltage.

A charging mode control method of an external device connected to a computing system according to various embodiments of the present disclosure may include an operation for charging the external device through a first charging mode, an operation for monitoring a current and a voltage in the computing system, and an operation for changing the first charging mode into a second charging mode on the basis of the monitoring result.

The operation for monitoring the current and voltage according to various embodiment of the present disclosure may include an operation for generating an adaptor limit alarm signal according to a predefined condition and an operation for generating a protection alarm signal when the adaptor alarm signal is detected more than a reference count. In this case, the second charging mode may be a charging mode lower than the first charging mode.

The adaptor limit alarm signal according to various embodiments of the present disclosure may occur when an input current provided to the computing system is detected more than a threshold value or the system voltage of the computing system is detected less than a reference value. Additionally, the adaptor limit alarm signal may be maintained for a first time.

The protection alarm signal according to various embodiments of the present disclosure may be generated when the adaptor limit alarm signal is detected more than the reference count at a second time interval. Additionally, the protection alarm signal may be maintained for a third time and the second charging mode may not be changed for the third time.

According to various embodiments of the present disclosure, when the monitoring result indicates a down adjustment of the charging mode, the second charging mode is a lower charging mode with respect to the first charging mode and when the monitoring result indicates an up adjustment of the charging mode, the second charging mode is an upper charging mode with respect to the first charging mode According to various embodiments of the present disclosure, when the monitoring result indicates a down adjustment of the charging mode and the first charging mode is the lowest charging mode, the charging of the external device may be stopped. Additionally, when the monitoring result indicates an up adjustment of the charging mode and the first charging mode is the highest charging mode, the second charging mode may be identical to the first charging mode.

Figure 13:
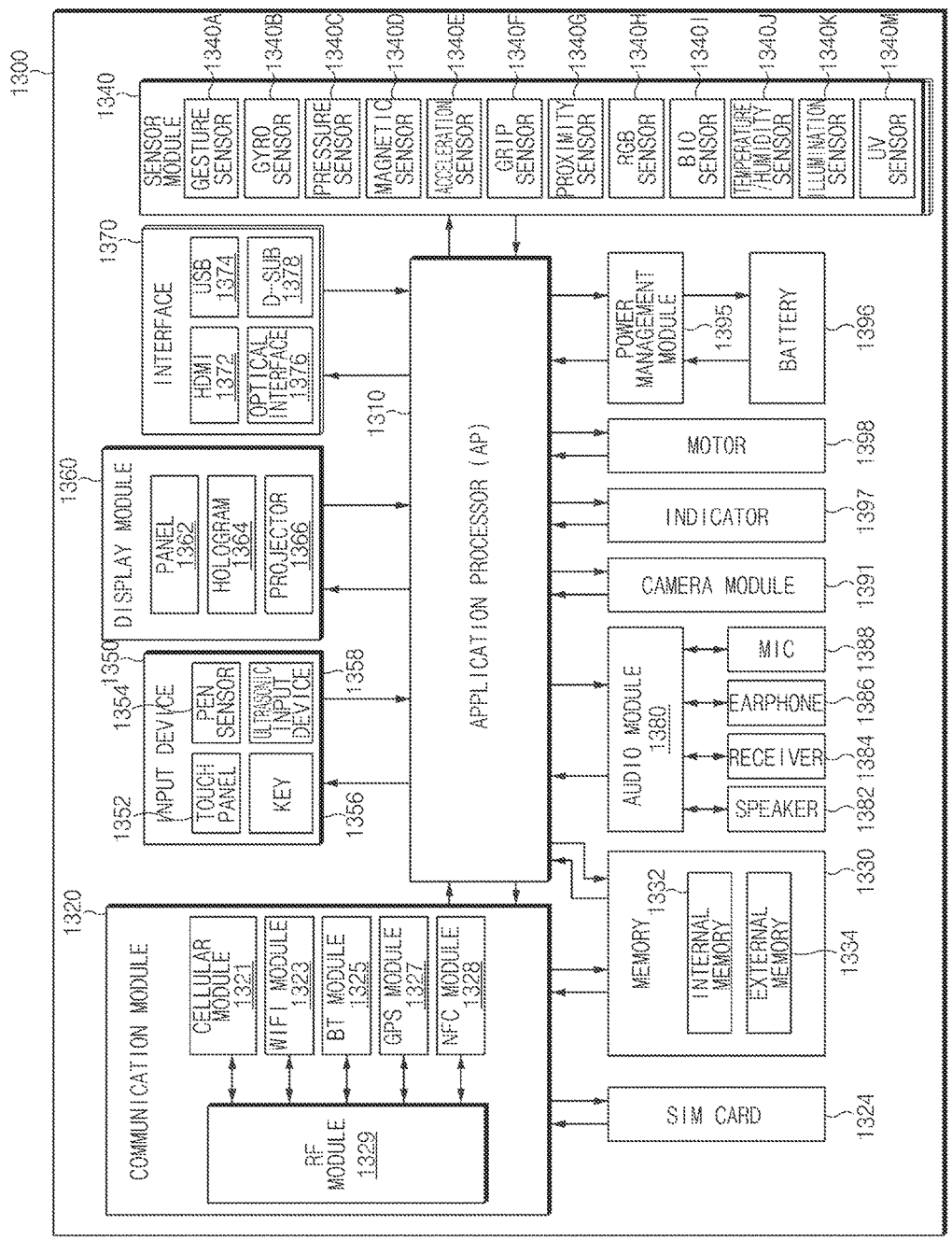
FIG. 13 is a block diagram illustrating an electronic device according to an embodiment of the present disclosure.

FIG. 13 is a block diagram illustrating an electronic device according to various embodiments of the present disclosure.

Referring to FIG. 13, the electronic device 1300 includes at least one application processor (AP) 1310, a communication module 1320, a subscriber identification module (SIM) card 1324, a memory 1330, a sensor module 1340, an input device 1350, a display 1360, an interface 1370, an audio module 1380, a camera module 1391, a power management module 1395, a battery 1396, an indicator 1397, and a motor 1398.

The AP 1310 may control a plurality of hardware or software components connected to the AP 1310 and also may perform various data processing and operations with multimedia data by executing an operating system or an application program. The AP 1310 may be implemented with a system on chip (SoC), for example. According to an embodiment of the present disclosure, the AP 1310 may further include a GPU (not shown).

The communication module 1320 may perform data transmission in a communication between the electronic device 1300 and other electronic devices connected thereto through a network. According to an embodiment of the present disclosure, the communication module 1320 may include a cellular module 1321, a Wi-Fi module 1323, a Bluetooth (BT) module 1325, a GPS module 1327, a near-field communication (NFC) module 1328, and a radio frequency (RF) module 1329.

The cellular module 1321 may provide voice calls, video calls, text services, or interne services through a communication network (for example, long term evolution (LTE), long term evolution-advanced (LTE-A), code division multiple access (CDMA), wideband CDMA (WCDMA), universal mobile telecommunications system (UMTS), wireless broadband (WiBro), or global system for mobile communications (GSM)). The cellular module 1321 may perform a distinction and authentication operation on an electronic device in a communication network by using a subscriber identification module (for example, the SIM card 1324), for example. According to an embodiment of the present disclosure, in order to distinguish an electronic device, instead of a subscriber identification module, the serial number of an operating system for driving an electronic device or identification information built in the main board of an electronic device may be used. According to an embodiment of the present disclosure, the cellular module 1321 may perform at least part of a function that the AP 1310 provides. For example, the cellular module 1321 may perform at least part of a multimedia control function.

According to an embodiment of the present disclosure, the cellular module 1321 may further include a communication processor (CP). Additionally, the cellular module 1321 may be implemented with SoC, for example. As shown in FIG. 13, components such as the cellular module 1321 (for example, a CP), the memory 1330, or the power management module 1395 are separated from the AP 1310, but according to an embodiment of the present disclosure, the AP 1310 may be implemented including some of the above-mentioned components (for example, the cellular module 1321).

According to an embodiment of the present disclosure, the AP 1310 or the cellular module 1321 (for example, a CP) may load instructions or data, which are received from a nonvolatile memory or at least one of other components connected thereto, into a volatile memory and then may process them. Furthermore, the AP 1310 or the cellular module 1321 may store data received from or generated by at least one of other components in a nonvolatile memory.

Each of the Wi-Fi module 1323, the BT module 1325, the GPS module 1327, and the NFC module 1328 may include a processor for processing data transmitted/received through a corresponding module. Although the cellular module 1321, the Wi-Fi module 1323, the BT module 1325, the GPS module 1327, and the NFC module 1328 are shown as separate blocks in FIG. 13, according to an embodiment of the present disclosure, some (for example, at least two) of the cellular module 1321, the Wi-Fi module 1323, the BT module 1325, the GPS module 1327, and the NFC module 1328 may be included in one integrated chip (IC) or an IC package. For example, at least some (for example, a CP corresponding to the cellular module 1321 and a Wi-Fi processor corresponding to the Wi-Fi module 1323) of the cellular module 1325, the Wi-Fi module 1327, the BT module 1328, the GPS module 1321, and the NFC module 1323 may be implemented with one SoC.

The RF module 1329 may be responsible for data transmission, for example, the transmission of an RF signal. Although not shown in the drawings, the RF module 1329 may include a transceiver, a power amp module (PAM), a frequency filter, or a low noise amplifier (LNA). Additionally, the RF module 1329 may further include components for transmitting/receiving electromagnetic waves on a free space in a wireless communication, for example, conductors or conducting wires. Although the cellular module 1321, the Wi-Fi module 1323, the BT module 1325, the GPS module 1327, and the NFC module 1328 share one RF module 1329 shown in FIG. 13, according to an embodiment of the present disclosure, at least one of the cellular module 1321, the Wi-Fi module 1323, the BT module 1325, the GPS module 1327, and the NFC module 1328 may perform the transmission of an RF signal through an additional RF module.

The SIM card 1324 may be a card including a subscriber identification module and may be inserted into a slot formed at a specific position of an electronic device. The SIM card 1324 may include unique identification information (for example, an integrated circuit card identifier (ICCID)) or subscriber information (for example, an international mobile subscriber identity (IMSI)).

The memory 1330 may include an internal memory 1332 or an external memory 1334. The internal memory 1332 may include at least one of a volatile memory (for example, dynamic random access memory (DRAM), static RAM (SRAM), synchronous dynamic RAM (SDRAM)) and a non-volatile memory (for example, one time programmable read-only memory (OTPROM), programmable ROM (PROM), erasable and programmable ROM (EPROM), electrically erasable and programmable ROM (EEPROM), mask ROM, flash ROM, NAND flash memory, and NOR flash memory).

According to an embodiment of the present disclosure, the internal memory 1332 may be a Solid State Drive (SSD). The external memory 1334 may further include flash drive, for example, compact flash (CF), secure digital (SD), micro secure digital (Micro-SD), mini secure digital (Mini-SD), extreme digital (xD), or memory stick. The external memory 1334 may be functionally connected to the electronic device 1300 through various interfaces. According to an embodiment of the present disclosure, the electronic device 1300 may further include a storage device (or a storage medium) such as a hard drive.

The sensor module 1340 measures physical quantities or detects an operating state of the electronic device 1300, thereby converting the measured or detected information into electrical signals. The sensor module 1340 may include at least one of a gesture sensor 1340A, a gyro sensor 1340B, a pressure sensor 1340C, a magnetic sensor 1340D, an acceleration sensor 1340E, a grip sensor 1340F, a proximity sensor 1340G, a color sensor 1340H (for example, a red, green, blue (RGB) sensor), a bio sensor 1340I, a temperature/humidity sensor 1340J, an illumination sensor 1340K, and an ultra violet (UV) sensor 1340M. Additionally/alternately, the sensor module 1340 may include an E-nose sensor (not shown), an electromyography (EMG) sensor, an electroencephalogram (EEG) sensor (not shown), an electrocardiogram (ECG) sensor (not shown), an infrared (IR) sensor (not shown), an iris sensor (not shown), or a fingerprint sensor (not shown). The sensor module 1340 may further include a control circuit for controlling at least one sensor therein.

The input module 1350 may include a touch panel 1352, a (digital) pen sensor 1354, a key 1356, or an ultrasonic input device 1358. The touch panel 1352 may recognize a touch input through at least one of capacitive, resistive, infrared, or ultrasonic methods, for example. Additionally, the touch panel 1352 may further include a control circuit. In the case of the capacitive method, both direct touch and proximity recognition are possible. The touch panel 1352 may further include a tactile layer. In this case, the touch panel 1352 may provide a tactile response to a user.

The (digital) pen sensor 1354 may be implemented through a method similar or identical to that of receiving a user's touch input or an additional sheet for recognition. The key 1356 may include a physical button, a touch key, an optical key, or a keypad, for example. The ultrasonic input device 1358, as a device checking data by detecting sound waves through a microphone (for example, the microphone 1388) in the electronic device 1300, may provide wireless recognition through an input tool generating ultrasonic signals. According to an embodiment of the present disclosure, the electronic device 1300 may receive a user input from an external device (for example, a computer or a server) connected to the electronic device 200 through the communication module 1320.

The display 1360 may include a panel 1362, a hologram device 1364, or a projector 1366. The panel 1362 may include a liquid-crystal display (LCD) or an AM-OLED. The panel 1362 may be implemented to be flexible, transparent, or wearable, for example. The panel 1362 and the touch panel 1352 may be configured with one module. The hologram 1364 may show three-dimensional images in the air by using the interference of light. The projector 1366 may display an image by projecting light on a screen. The screen, for example, may be placed inside or outside the electronic device 1300. According to an embodiment of the present disclosure, the display 1360 may further include a control circuit for controlling the panel 1362, the hologram device 1364, or the projector 1366.

The interface 1370 may include a high-definition multimedia interface (HDMI) 1372, a USB 1374, an optical interface 1376, or a D-subminiature (sub) 1378, for example. Additionally/alternately, the interface 1370 may include a mobile high-definition link (MHL) interface, a SD card/multi-media card (MMC) interface, or an infrared data association (IrDA) standard interface.

The audio module 1380 may convert sound and electrical signals in both directions. The audio module 1380 may process sound information inputted/outputted through a speaker 1382, a receiver 1384, an earphone 1386, or a microphone 1388.

The camera module 1391, as a device for capturing a still image and a video, may include at least one image sensor (for example, a front sensor or a rear sensor), a lens (not shown), an image signal processor (ISP) (not shown), or a flash (not shown) (for example, an LED or a xenon lamp).

The power management module 1395 may manage the power of the electronic device 1300. Although not shown in the drawings, the power management module 1395 may include a power management integrated circuit (PMIC), a charger integrated circuit (IC), or a battery or fuel gauge, for example.

The PMIC may be built in an IC or SoC semiconductor, for example. A charging method may be classified as a wired method and a wireless method. The charger IC may charge a battery and may prevent overvoltage or overcurrent flow from a charger. According to an embodiment of the present disclosure, the charger IC may include a charger IC for at least one of a wired charging method and a wireless charging method. Wireless charging methods include a magnetic resonance method, a magnetic induction method, or an electromagnetic method. An additional circuit for wireless charging, such as a coil loop, a resonant circuit, or a rectifier circuit, may be added.

The battery gauge may measure the remaining amount of the battery 1396, or a voltage, current, or temperature of the battery 396 during charging. The battery 1396 may store or generate electricity and may supply power to the electronic device 1300 by using the stored or generated electricity. The battery 1396, for example, may include a rechargeable battery or a solar battery.

The indicator 1397 may display a specific state of the electronic device 1300 or part thereof (for example, the AP 1310), for example, a booting state, a message state, or a charging state. The motor 1398 may convert electrical signals into mechanical vibration. Although not shown in the drawings, the electronic device 1300 may include a processing device (for example, a GPU) for mobile TV support. A processing device for mobile TV support may process media data according to the standards such as digital multimedia broadcasting (DMB), digital video broadcasting (DVB), or media flow.

A computing system for controlling a charging mode of an external device according to various embodiments of the present disclosure may include an external port providing a connection with the external device, an input current monitoring unit for monitoring an input current provided from an adaptor, a system voltage monitoring unit for monitoring a system voltage of the computing system, a trigger circuit unit for generating an adaptor limit alarm signal according to the input current monitored by the input current monitoring unit and the system voltage monitored by the system voltage monitoring unit, and a controller for detecting the adaptor limit alarm signal generated by the trigger circuit unit. The controller may change a charging mode of charging the external device on the basis of the adaptor limit alarm signal.

Additionally, when the adaptor limit alarm signal is detected more than a reference count at a predetermined time interval, the controller may generate a protection alarm signal and may change the charging mode into a lower charging mode according to the protection alarm signal.

Additionally, when the adaptor limit alarm signal occurs more than a reference count for a predetermined time, the controller may change the charging mode into a lower charging mode.

Additionally, the controller may change a charging mode on the basis of the RSOC change amount of the remaining battery power amount of the external device.

Additionally, the computing system may further include a display device and an input device. When the external device is connected to the export port, the computing system may display a plurality of selectable charging modes on the display device and may determine one of the plurality of selectable charging modes as a charging mode according to a user input received through the input device. Additionally, the display device and the input device may be implemented with one touch display panel.

Additionally, when the charging mode is determined by a fast charging mode, the controller may transmit a control signal on the changed charging mode to the external device and the control signal may be used for setting of battery charging according to the fast charging mode.

According to various embodiments of the present disclosure, a charging mode of an external device connected to a computing system may be determined depending on a user's selection.

Additionally, according to various embodiments of the present disclosure, a charging mode is changed actively depending on a situation of a changing current or voltage during charging, thereby providing an optimized charging efficiency without causing an overload of an adaptor or a computing system.

Each of the above-mentioned components of the electronic device according to various embodiments of the present disclosure may be configured with at least one component and the name of a corresponding component may vary according to the kind of an electronic device. An electronic device according to an embodiment of the present disclosure may be configured including at least one of the above-mentioned components or additional other components. Additionally, some components in an electronic device according to an embodiment of the present disclosure may be configured as one entity, so that functions of previous corresponding components are performed identically.

The term ¡°module¡± used in this disclosure, for example, may mean a unit including a combination of at least one of hardware, software, and firmware. The term "module" and the term "unit", "logic", "logical block", "component", or "circuit" may be interchangeably used. "module" may be a minimum unit or part of an integrally configured component. "module" may be a minimum unit performing at least one function or part thereof "module" may be implemented mechanically or electronically. For example, "module" according to various embodiments of the present disclosure may include at least one of an application-specific integrated circuit (ASIC) chip performing certain operations, field-programmable gate arrays (FPGAs), or a programmable-logic device, all of which are known or to be developed in the future.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. A computing system for controlling a charging mode of an external device, the computing system comprising:
   an external port configured to provide a connection with the external device;
   an input current monitoring circuit configured to monitor an input current provided from an adaptor;
   a system voltage monitoring circuit configured to monitor a system voltage of the computing system;
   a trigger circuit configured to generate an adaptor limit alarm signal according to the input current that is monitored by the input current monitoring circuit and the system voltage monitored by the system voltage monitoring circuit; and
   at least one processor configured to:
      detect the adaptor limit alarm signal generated by the trigger circuit,
      generate a protection alarm signal when a number of adaptor limit alarm signals exceeds a reference count at a predetermined time interval, and
      change the charging mode for charging the external device into a lower stage charging mode according to the protection alarm signal.

2. The computing system according to claim 1, wherein the at least one processor is further configured to change a charging mode based on a Relative State of Charge (RSOC) change amount of a remaining battery power amount of the external device.

3. The computing system according to claim 1, further comprising:
   a display and an input interface,
   wherein, when the external device is connected to the external port, a plurality of selectable charging modes are displayed on the display, and
   wherein, according to a user input received through the input interface, one of the plurality of selectable charging modes is determined as a charging mode for the external device.

4. The computing system according to claim 3, wherein the display and the input interface are implanted as one touch display panel.

5. The computing system according to claim 1,
   wherein when the charging mode is determined to be a fast charging mode, the at least one processor is further configured to transmit a control signal for the changed charging mode to the external device, and
   wherein the control signal is used for setting battery charging according to the fast charging mode in the external device.

* * * * *